United States Patent
Johansson et al.

(10) Patent No.: US 7,456,069 B2
(45) Date of Patent: Nov. 25, 2008

(54) METHOD IN THE FABRICATION OF AN INTEGRATED INJECTION LOGIC CIRCUIT

(75) Inventors: Ted Johansson, Djursholm (SE); Hans Norstroem, Solna (SE)

(73) Assignee: Infineon Technologies AG, Munich (DE)

( * ) Notice: Subject to any disclaimer, the term of this patent is extended or adjusted under 35 U.S.C. 154(b) by 486 days.

(21) Appl. No.: 11/245,469

(22) Filed: Oct. 6, 2005

(65) Prior Publication Data

US 2006/0105517 A1    May 18, 2006

(30) Foreign Application Priority Data

Oct. 6, 2004  (EP)  ................. 04023839

(51) Int. Cl.
*H01L 21/8228* (2006.01)

(52) U.S. Cl. .................. 438/325; 438/338; 257/E21.61

(58) Field of Classification Search .................. 438/204, 438/236, 323–327, 336, 338, 342; 257/E21.609, 257/E21.61, E21.612
See application file for complete search history.

(56) References Cited

U.S. PATENT DOCUMENTS

| | | | |
|---|---|---|---|
| 4,512,075 A | 4/1985 | Vora | |
| 5,162,252 A * | 11/1992 | Kanda et al. | 438/324 |
| 5,504,368 A | 4/1996 | Sawada | |
| 5,831,328 A | 11/1998 | Yamamoto et al. | |
| 6,232,193 B1 | 5/2001 | Chen et al. | |
| 6,573,146 B2 * | 6/2003 | Kim et al. | 438/325 |
| 6,610,578 B2 | 8/2003 | Norström et al. | |
| 2003/0102525 A1 | 6/2003 | Ejiri | |

FOREIGN PATENT DOCUMENTS

| | | |
|---|---|---|
| DE | 196 14 876 C1 | 11/1997 |
| EP | 0 743 682 A2 | 11/1996 |
| GB | 1 485 970 | 9/1977 |
| JP | 55-009464 | 1/1980 |
| WO | WO 02/091463 A1 | 11/2002 |

* cited by examiner

*Primary Examiner*—Chandra Chaudhari
(74) *Attorney, Agent, or Firm*—Maginot Moore & Beck

(57) ABSTRACT

A method in the fabrication of an $I^2L$ circuit comprises (i) forming a common base of a lateral bipolar transistor and emitter of a vertical bipolar multicollector transistor, a common collector of the lateral transistor and base of the vertical multicollector transistor, and an emitter of the lateral transistor in a substrate; (ii) forming, from a first deposited polycrystalline layer, a contact region for the common collector/base and a contact region for the emitter of the lateral transistor; (iii) forming an isolation structure for electric isolation of the polycrystalline contact region for the common collector/base; and (iv) forming, from a second deposited polycrystalline layer, a contact region for the common base/emitter and multiple collectors of the vertical multicollector transistor.

18 Claims, 7 Drawing Sheets

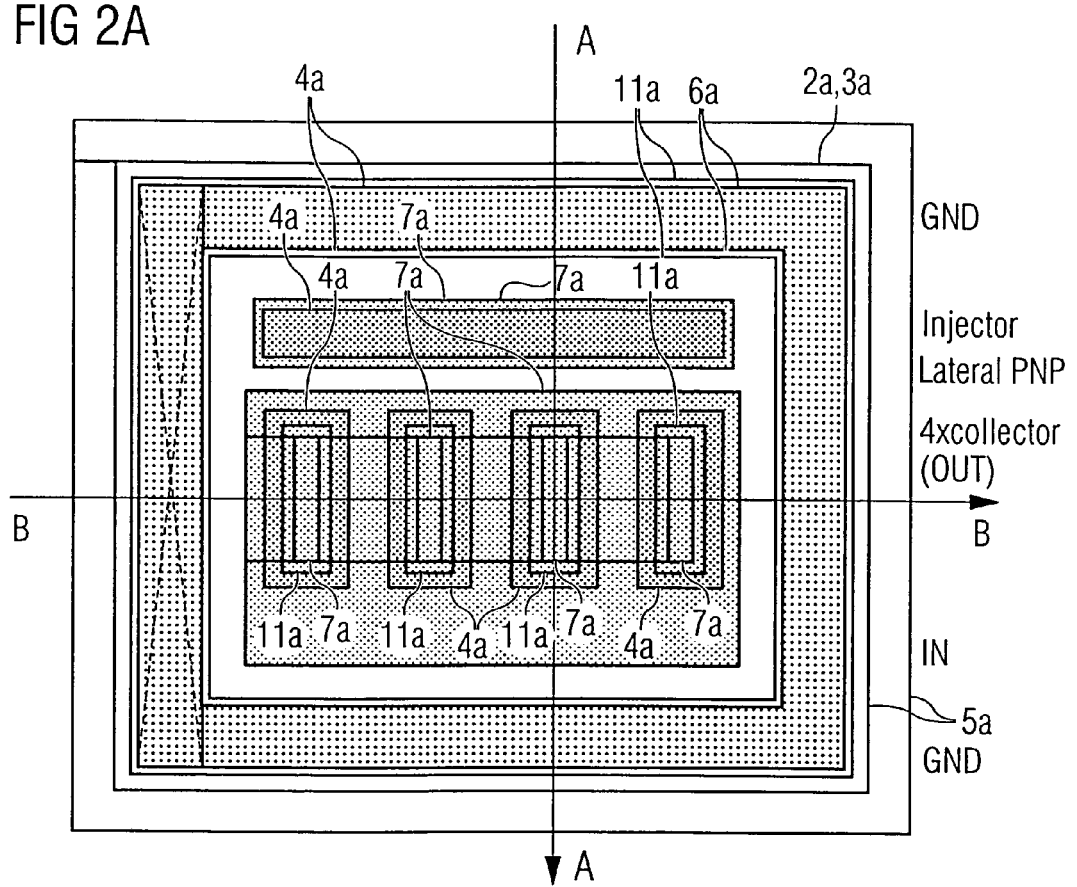

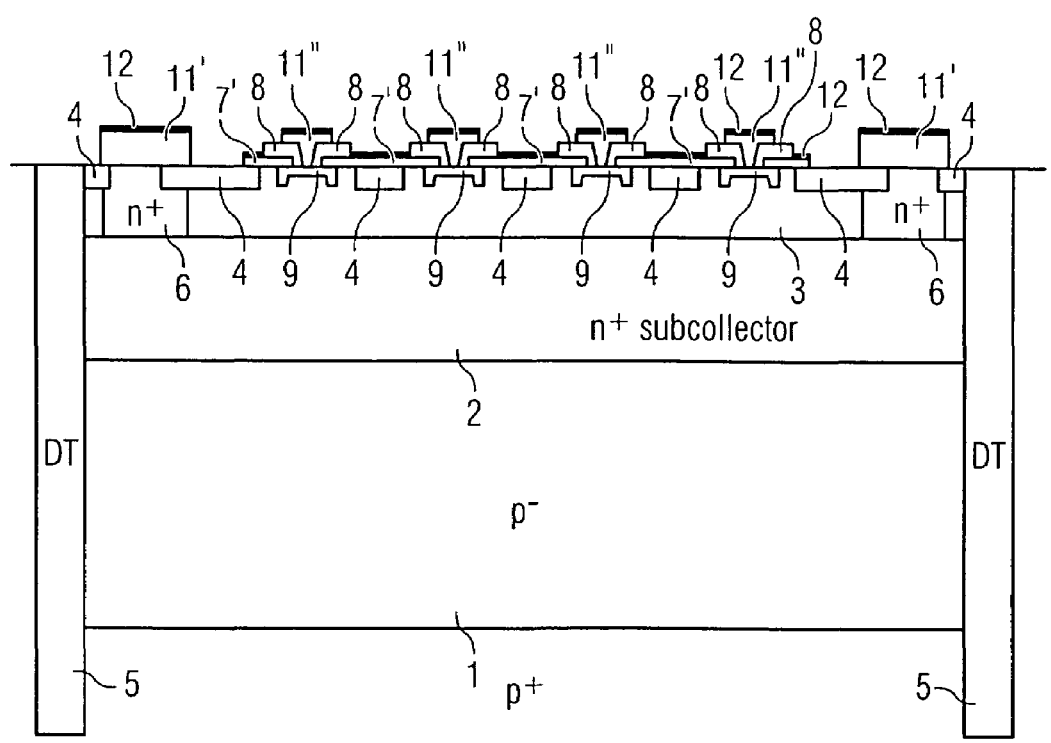

METHOD IN THE FABRICATION OF AN INTEGRATED INJECTION LOGIC CIRCUIT

CROSS-REFERENCE TO RELATED APPLICATION

This application claims priority from European Patent Application No. 04023839.6, which was filed on Oct. 6, 2004 and is incorporated herein by reference in its entirety.

BACKGROUND OF THE INVENTION

1. Field of the Invention

The present invention generally relates to the field of integrated circuit technology, and more specifically the invention relates to a method in the fabrication of an integrated injection logic circuit, and to an integrated injection logic circuit.

2. Description of Prior Art

BiCMOS technology combines bipolar and CMOS devices on a single chip. BiCMOS technology has proven to be very useful for the increased integration in circuits used for telecommunications, in particular wireless applications, since bipolar devices are widely utilized for high-frequency parts, e.g. for analog radio functions, while CMOS technology is used for digital and mixed signal parts, such as data interfaces with other circuits in the systems. CMOS technology is also advantageous for logic circuits because of the high device density area and the low power consumption during switching. Therefore BiCMOS technology has been used during the last decade for increased integration of basically bipolar circuit blocks, which interface to digital blocks.

The BiCMOS processes used for wireless applications can be characterized as high-end BiCMOS processes, where a CMOS process is added to an existing high-performance bipolar process. Performance, not cost, is prioritized in contrary to the low-end BiCMOS which adds moderate-speed bipolar transistors into a high-performance CMOS process. U.S. Pat. No. 6,610,578 by Norström et al. and the international patent publication WO 02/091463 A1 by Johansson et al. describe high-performance double-poly bipolar processes for high frequency radio applications which are extendable to BiCMOS with only minor modifications to the bipolar process. The design of a lateral PNP transistor in such a process is described in the above U.S. patent.

Integrated-injection logic ($I^2L$ or Multi-Transistor Logic MTL) was invented in the early 1970's. The technology offers high packing density, low power consumption, simple manufacturing technology, and good current drive ability, and can easily be mixed with linear functions and other types of logic on the same wafer. The basic $I^2L$ cell consists of a lateral PNP transistor $Q_1$ and a vertical multicollector NPN transistor $Q_2$ tightly connected (super integrated). This can be seen in FIGS. 1a-b, taken from S. M. Sze (Ed.), "Physics of Semiconductor Devices", 2nd ed., Wiley, 1981. pp. 182-183. Current is injected from the lateral PNP transistor $Q_1$ into the base of vertical multicollector NPN transistor $Q_2$. The NPN transistor $Q_2$ is operated in inverted mode. As a consequence, the reverse beta of the NPN transistor may be too low in certain process technologies, making $I^2L$ operation not possible without process modifications. As a medium-speed technology $I^2L$ was very successful, although the advancement in MOS technology soon reduced its role for large high-speed digital circuit, such as the microprocessor we have today.

In U.S. Pat. No. 5,504,368 by Sawada a circuit device is disclosed wherein separate vertical transistors are formed for NPN high-speed operation (useful for bipolar RF operation) and NPN high reverse beta operation (useful for the $I^2L$) and a lateral PNP transistor for the $I^2L$ injector.

German Patent No. 196 14 876 by Eichler and Wallner teaches how to integrate $I^2L$ with high-voltage NPN transistors.

In U.S. Pat. No. 5,831,328 by Yamamoto and Tominaga a fabrication process for an $I^2L$ semiconductor device is disclosed wherein polycrystalline silicon collector contacts are used to solve metal wiring problems.

In U.S. Pat. No. 6,232,193 by Chen et al. an injection logic device is disclosed wherein field oxide is used to separate the multi-collectors from each other. Polycrystalline silicon is used for contacting the collectors. A number of additional features improve the device even further.

SUMMARY OF THE INVENTION

The main drawback of BiCMOS technology is the high process complexity, which leads to higher fabrication costs and increased fabrication cycle time.

Conventional semiconductor processes for $I^2L$ are compatible with old diffused bipolar processes; however the concept is not directly applicable to modern bipolar process technologies.

The device disclosed in U.S. Pat. No. 5,504,368 requires a complex and non-conventional fabrication process. Further, the device seems not to use available space optimally.

Accordingly, it would be advantageous to provide a method in the fabrication of an integrated injection logic circuit that overcomes the problems associated with the prior art described above.

It is in this respect a particular advantage would be to provide such a method, which is compatible with modern bipolar process technologies, such as those used for fabrication of double-poly bipolar transistors, which are used for high-performance bipolar and BiCMOS circuits of today.

It would also be advantageous to provide such a method, which is simple and straight-forward and which requires a minimum of process steps.

Furthermore, it would be advantageous to provide such a method, by which good device isolation is obtained.

It would also be advantageous to provide such a method, by which a compact and high density injection logic circuit can be fabricated.

Additionally, it would be advantageous to provide such a method, by which an injection logic circuit containing high performance transistors can be fabricated.

Yet another advantage would be to provide a method for manufacturing a radio transceiver device encompassing an integrated injection logic circuit and a bipolar amplifier device in bipolar process.

Furthermore, it would be advantageous to provide an integrated injection logic circuit, which can be fabricated by a method having the above advantages, and which contains high performance transistors.

In accordance with a first aspect, the invention provides a method in the fabrication of an integrated injection logic circuit having a lateral bipolar transistor of a first doping type and a vertical bipolar multicollector transistor of a second doping type opposite to said first doping type, wherein the base of the lateral bipolar transistor is common with the emitter of the vertical bipolar multicollector transistor, and the collector of the lateral bipolar transistor is common with the base of the vertical bipolar multicollector transistor, the method including the steps of:

forming the common base of the lateral bipolar transistor and emitter of the vertical bipolar multicollector transistor; the common collector of the lateral bipolar transistor and base of the vertical bipolar multicollector transistor; and the emitter of the lateral bipolar transistor in a substrate, depositing a first polycrystalline layer on the substrate and forming, from the first polycrystalline layer, a polycrystalline contact region for the common collector of the lateral bipolar transistor and base of the vertical bipolar multicollector transistor; and a polycrystalline contact region for the emitter of the lateral bipolar transistor, depositing an isolation layer and forming, from the isolation layer, an isolation structure for electric isolation of the polycrystalline contact region for the common collector of the lateral bipolar transistor and base of the vertical bipolar multicollector transistor, and depositing a second polycrystalline layer and forming, from the second polycrystalline layer, a polycrystalline contact region for the common base of the lateral bipolar transistor and emitter of the vertical bipolar multicollector transistor; and multiple collectors of the vertical bipolar multicollector transistor.

In accordance with a second aspect, the invention provides a method for manufacturing a logic circuit device encompassing a plurality of integrated injection logic circuits, said method including the method in the fabrication of an integrated injection logic circuit having a lateral bipolar transistor of a first doping type and a vertical bipolar multicollector transistor of a second doping type opposite to said first doping type, wherein the base of the lateral bipolar transistor is common with the emitter of the vertical bipolar multicollector transistor, and the collector of the lateral bipolar transistor is common with the base of the vertical bipolar multicollector transistor, the method including the steps of:

forming the common base of the lateral bipolar transistor and emitter of the vertical bipolar multicollector transistor; the common collector of the lateral bipolar transistor and base of the vertical bipolar multicollector transistor; and the emitter of the lateral bipolar transistor in a substrate, depositing a first polycrystalline layer on the substrate and forming, from the first polycrystalline layer, a polycrystalline contact region for the common collector of the lateral bipolar transistor and base of the vertical bipolar multicollector transistor; and a polycrystalline contact region for the emitter of the lateral bipolar transistor, depositing an isolation layer and forming, from the isolation layer, an isolation structure for electric isolation of the polycrystalline contact region for the common collector of the lateral bipolar transistor and base of the vertical bipolar multicollector transistor, and depositing a second polycrystalline layer and forming, from the second polycrystalline layer, a polycrystalline contact region for the common base of the lateral bipolar transistor and emitter of the vertical bipolar multicollector transistor; and multiple collectors of the vertical bipolar multicollector transistor in the fabrication of each of the plurality of integrated injection logic circuits.

In accordance with a third aspect, the invention provides a method for manufacturing a radio transceiver device encompassing an integrated injection logic circuit, said method including the method in the fabrication of an integrated injection logic circuit having a lateral bipolar transistor of a first doping type and a vertical bipolar multicollector transistor of a second doping type opposite to said first doping type, wherein the base of the lateral bipolar transistor is common with the emitter of the vertical bipolar multicollector transistor, and the collector of the lateral bipolar transistor is common with the base of the vertical bipolar multicollector transistor, the method including the steps of:

forming the common base of the lateral bipolar transistor and emitter of the vertical bipolar multicollector transistor; the common collector of the lateral bipolar transistor and base of the vertical bipolar multicollector transistor; and the emitter of the lateral bipolar transistor in a substrate, depositing a first polycrystalline layer on the substrate and forming, from the first polycrystalline layer, a polycrystalline contact region for the common collector of the lateral bipolar transistor and base of the vertical bipolar multicollector transistor; and a polycrystalline contact region for the emitter of the lateral bipolar transistor, depositing an isolation layer and forming, from the isolation layer, an isolation structure for electric isolation of the polycrystalline contact region for the common collector of the lateral bipolar transistor and base of the vertical bipolar multicollector transistor, and depositing a second polycrystalline layer and forming, from the second polycrystalline layer, a polycrystalline contact region for the common base of the lateral bipolar transistor and emitter of the vertical bipolar multicollector transistor; and multiple collectors of the vertical bipolar multicollector transistor.

In accordance with a fourth aspect, the invention provides an integrated injection logic circuit having a lateral bipolar transistor of a first doping type and a vertical bipolar multicollector transistor of a second doping type opposite to said first doping type, wherein the base of the lateral bipolar transistor is common with the emitter of the vertical bipolar multicollector transistor, and the collector of the lateral bipolar transistor is common with the base of the vertical bipolar multicollector transistor, wherein:

the common base of the lateral bipolar transistor and emitter of the vertical bipolar multicollector transistor; the common collector of the lateral bipolar transistor and base of the vertical bipolar multicollector transistor; and the emitter of the lateral bipolar transistor are provided in a substrate, a polycrystalline contact region for the common collector of the lateral bipolar transistor and base of the vertical bipolar multicollector transistor, and a polycrystalline contact region for the emitter of the lateral bipolar transistor are provided on said substrate, an isolation structure is provided for electric isolation of the polycrystalline contact region for the common collector of the lateral bipolar transistor and base of the vertical bipolar multicollector transistor, and a polycrystalline contact region for the common base of the lateral bipolar transistor and emitter of the vertical bipolar multicollector transistor; and multiple collectors of the vertical bipolar multicollector transistor are provided on said substrate.

In accordance with a fifth aspect, the invention provides a radio transceiver device having a bipolar amplifier device and the integrated injection logic circuit having a lateral bipolar transistor of a first doping type and a vertical bipolar multicollector transistor of a second doping type opposite to said first doping type, wherein the base of the lateral bipolar transistor is common with the emitter of the vertical bipolar multicollector transistor, and the collector of the lateral bipolar transistor is common with the base of the vertical bipolar multicollector transistor, wherein:

the common base of the lateral bipolar transistor and emitter of the vertical bipolar multicollector transistor; the common collector of the lateral bipolar transistor and base of the vertical bipolar multicollector transistor; and the emitter of the lateral bipolar transistor are provided in a substrate, a polycrystalline contact region for the common collector of the lateral bipolar transistor and base of the vertical bipolar multicollector transistor, and a polycrystalline contact region for the emitter of the lateral bipolar transistor are provided on said substrate, an isolation structure is provided for electric isolation of the polycrystalline contact region for the common collector of the lateral bipolar transistor and base of the vertical bipolar multicollector transistor, and a polycrystalline contact region for the common base of the lateral bipolar transistor and emitter of the vertical bipolar multicollector transistor; and multiple collectors of the vertical bipolar multicollector transistor are provided on said substrate on a single die.

According to one embodiment of the present invention, there is provided a method in the manufacturing of an integrated injection logic circuit comprising a lateral bipolar transistor of a first doping type and a vertical bipolar multicollector transistor of a second doping type opposite to said first doping type, wherein the base of the lateral bipolar transistor is common with the emitter of the vertical bipolar multicollector transistor and is referred to as a common base/emitter, and the collector of the lateral bipolar transistor is common with the base of the vertical bipolar multicollector transistor and is referred to as a common collector/base. The common base/emitter, the common collector/base, and the emitter of the lateral bipolar transistor are formed in a substrate by ion implantation and diffusion. The substrate may be a bulk or a silicon-on-insulator (SOI) substrate.

A first polycrystalline layer is deposited on the substrate and patterned to form a polycrystalline contact region for the common collector/base, and a polycrystalline contact region for the emitter of the lateral bipolar transistor. An isolation layer is deposited and patterned to form an isolation structure for electric isolation of the contact region for the common collector/base. Finally, a second polycrystalline layer is deposited and patterned to form a contact region for the common base/emitter, and multiple collectors of the vertical bipolar multicollector transistor.

Preferably, the common collector/base is formed as a plurality of laterally separated regions interconnected by the contact region for the common collector/base.

Several layouts are disclosed in the detailed description of embodiments. In one of these, the multiple collectors of the vertical bipolar multicollector transistor are arranged between the contact region for the emitter of the lateral bipolar transistor and the contact region for the common collector/base as seen in a lateral direction of the circuit. The multiple collectors are advantageously arranged along a straight line, which is essentially orthogonal to the lateral direction.

According to another embodiment of the present invention, there is provided a method for manufacturing a logic circuit device encompassing a plurality of integrated injection logic circuits. This method comprises the method of the previous embodiment of the invention in the manufacturing of each of the integrated injection logic circuits.

According to still another embodiment of the invention, there is provided a method for manufacturing a radio transceiver device encompassing an integrated injection logic circuit and a bipolar amplifier device, where the method comprises the above method in the manufacturing of the integrated injection logic circuit.

According to yet another of the invention there is provided an integrated injection logic circuit manufactured according to the above method in the manufacturing of the integrated injection logic circuit.

Further characteristics of the invention and advantages thereof will be evident from the detailed description of preferred embodiments of the present invention given hereinafter and the accompanying FIGS. 2-6, which are given by way of illustration only, and are thus not limitative of the present invention.

BRIEF DESCRIPTION OF THE DRAWINGS

FIG. 2a is a schematic layout of an integrated injection logic circuit according to an embodiment of the present invention. FIGS. 2b-c are cross-sectional views of the circuit of FIG. 2a along lines A-A and B-B.

Identical reference numerals are used throughout the Figures to indicate similar components and parts.

In order to give a thorough understanding of the present invention various embodiments will be described. It will be apparent to one skilled in the art that the invention may be practiced in other embodiments that depart from those explicitly disclosed. In other instances, detailed descriptions of methods well-known to one skilled in the art are omitted.

It shall be pointed out that the process steps described below are further detailed in the U.S. Pat. No. 6,610,578 and the international patent publication WO 02/091463 A1, the contents of which being hereby incorporated by reference. Particularly, the process steps described below may be performed simultaneously as corresponding process steps for fabrication of a high-performance bipolar transistor are performed. Such bipolar only process may be used for the fabrication of a radio transceiver device comprising amplifier structures and logic.

A first embodiment of a method in the fabrication of a monolithically integrated vertical device comprising a lateral bipolar PNP transistor and a vertical bipolar NPN multicollector transistor is described with reference to FIGS. 2a-c.

Figure 1A:
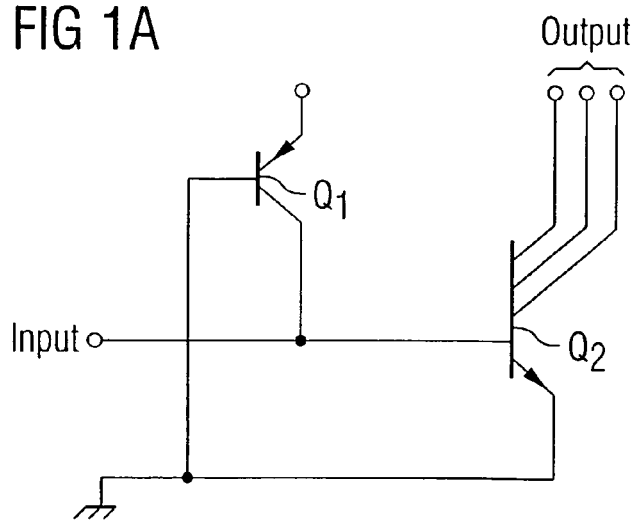
FIGS. 1a-b are a circuit scheme and a highly enlarged cross-sectional view of an integrated injection logic circuit according to the prior art.
Figure 1B:
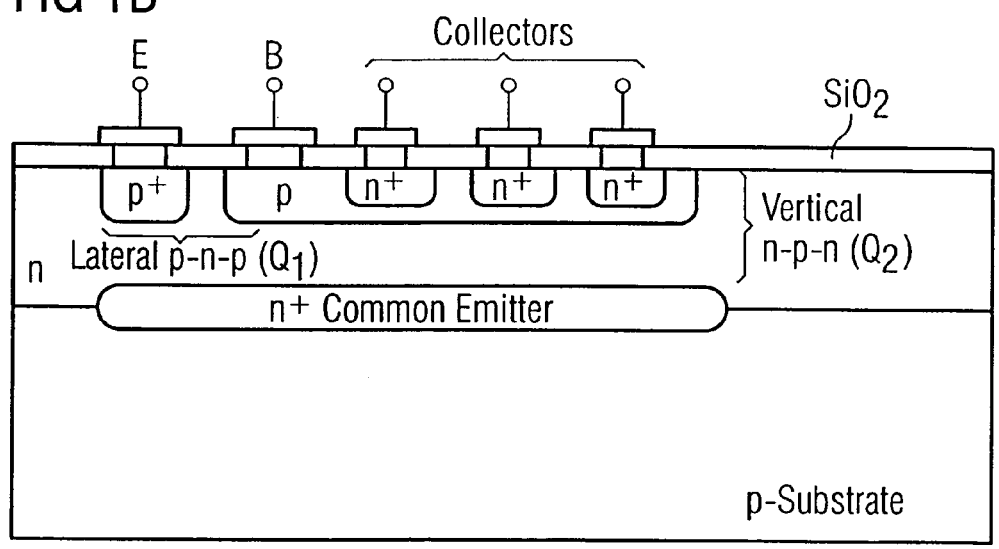
Figure 2B:
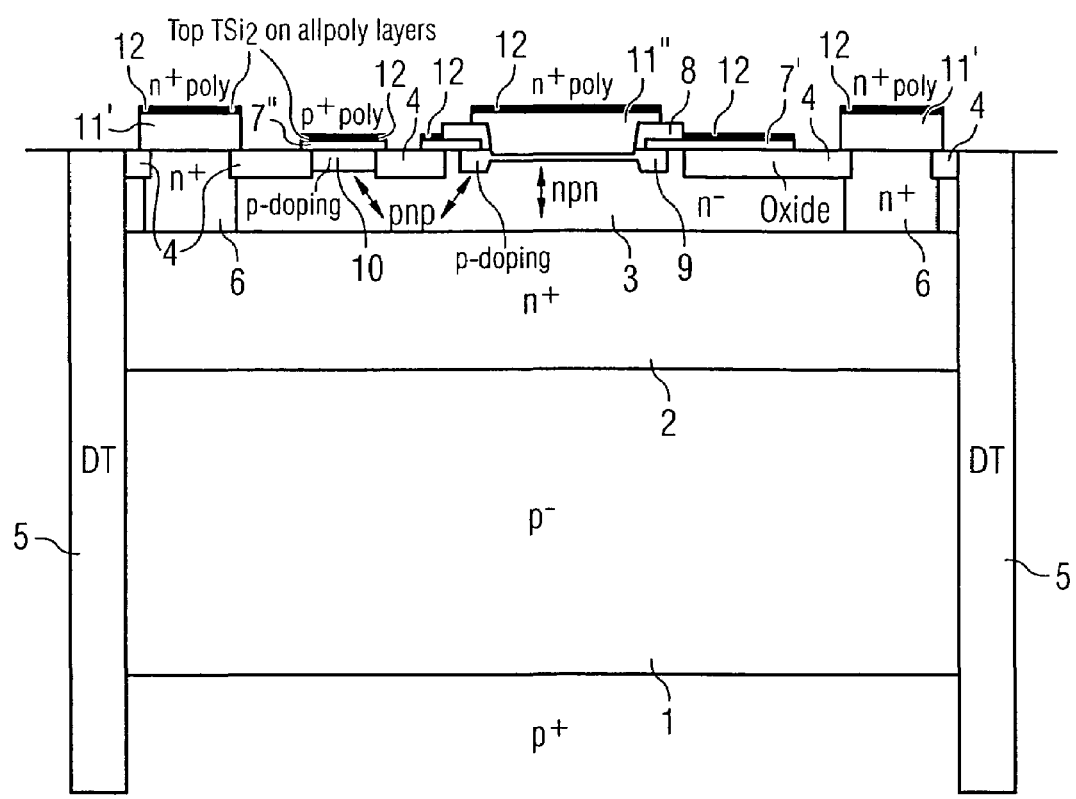

A p+/p− doped bulk substrate wafer 1 is provided as illustrated in FIGS. 2b-c. Alternatively, the wafer is a silicon-on-insulator (SOI) substrate wafer.

A buried n+ doped region 2, in the literature often denoted subcollector, is formed by means of ion implantation. A mask layout delimiting the buried n+ doped region 2 during implantation is denoted by 2a in FIG. 2a. If the substrate wafer is an SOI substrate wafer, the buried n+ doped region 2 does preferably not reach down to the insulator layer.

On top of the buried n+ doped region 2, an epitaxial silicon layer is deposited. A blanket boron implantation is made to p-dope this layer, thus creating a p-well region. An additional n-type implantation is made to form an n– doped well region 3 in the epitaxial layer. The n– doped well region 3 will simultaneously constitute the base of the lateral PNP transistor and the emitter of the vertical multicollector transistor. The mask layout delimiting the formation of the n– doped well region 3 is denoted by 3a in FIG. 2a. The monocrystalline structure including the epitaxial layer, in which the n– doped well region 3 is formed, is often referred to as the substrate in which active components are formed.

Next, isolation regions 4 are formed in the n– doped well region 3. The isolation regions 4 may be LOCOS isolation, shallow trench isolation (STI) or other isolation structures. Preferably, the isolation regions 4 are shallow enough to not reach down to the buried n+ doped region 2. The mask layout used for the formation of the shallow isolation regions 4 is denoted by 4a in FIG. 2a.

A device isolation structure 5, preferably a deep trench, is formed to surround the integrated injection logic circuit as can be seen by the mask layout, denoted by 5a in FIG. 2a, used for the formation of the device isolation structure 5. Alternatively, if the area outside the n-well region 3 (mask 3a) is a p-well region, thus creating a junction isolation for the device structure.

Then, an n+ doped sinker or contact plug structure 6 is formed to obtain electric contact from the buried n+ doped region 2 up to the substrate surface. The mask layout for the formation of the n+ doped sinker structure 6 is denoted by 6a in FIG. 2a.

A thin layer of polycrystalline silicon, referred to as a first polycrystalline layer, is deposited on the structure and is subsequently p+ doped. The first polycrystalline layer is patterned to form a first 7' and a second 7" polycrystalline contact region. The mask layout used for the formation of the contact regions 7' and 7" is denoted by 7a in FIG. 2a. An isolation layer is deposited thereon, from which isolation layer an isolation structure 8 for electric isolation of the first contact region 7' is formed.

In next step the structure is implanted with p-type dopant at low energy. A p doped surface region is formed in the substrate in openings defined by the isolation structure 8. Later heat treatments cause p-type dopants to diffuse from the first 7' and second 7" contact regions into the substrate to form the p doped regions 9, which are interconnected by the first contact region 7', and the emitter 10 of the lateral PNP transistor. The p doped regions 9, will simultaneously constitute the collector of the lateral PNP transistor and the base of the vertical multicollector transistor.

A second polycrystalline layer is deposited on the structure and is subsequently n+ doped. The second polycrystalline layer is patterned to form a polycrystalline contact region 11' for the common base of the lateral PNP transistor and emitter of the vertical multicollector transistor, and multiple collectors 11" for the vertical multicollector transistor. The mask layout used for the formation of the contact region 11' and the multiple collectors 11" is denoted by 11a in FIG. 2a.

It shall be appreciated that n type dopant diffuses from the multiple collectors 11" and into the p doped regions 9 during the later heat treatments, so that the pn-junction will be obtained below the surface of the substrate. Then, exposed silicon surfaces are silicided to form thin silicide layers 12 thereon, after which the process is continued in a conventional manner with metallization.

In FIG. 2b the lateral PNP transistor and the vertical multicollector NPN transistor are indicated. Their corresponding current paths are schematically indicated by directional arrows. The lateral PNP transistor consists of the emitter 10, the base 3, and the collector 9, and the corresponding contact regions are denoted by 7", 11', and 7'. Similarly, the vertical multicollector NPN transistor consists of the emitter 3, the base 9, and the multiple collectors 11". The contact regions for the emitter and base are denoted by 11' and 7', whereas the multiple collectors 11" are connected directly to metal via the silicide.

Preferably, the number of the multiple collectors 11" is equal to the number of p doped regions 9, and the multiple collectors 11" are aligned with the p doped regions 9, i.e. the multiple collectors 11" are formed to essentially overlap with the p doped regions 9.

As can be seen in FIG. 2b, the multiple collectors 11" of the vertical multicollector transistor are arranged between the contact region 7" for the emitter of the lateral transistor and the contact region 7' for the common collector of the lateral transistor and base of the vertical multicollector transistor.

As can be seen in FIG. 2c in connection with FIG. 2a, the multiple collectors 11" of the vertical multicollector transistor are basically arranged along a straight line, which is essentially orthogonal to the lateral direction.

The above method thus provides for a method, which is compatible with modern bipolar process technologies, such as those used for fabrication of double-poly bipolar transistors, without the need of further process steps. The method further provides for the fabrication of compact and high density injection logic with high-performance transistors.

If the above method is implemented in a process for fabricating a high-performance bipolar transistor, a collector of the high-performance bipolar transistor is formed in the substrate simultaneously as the common base of the lateral PNP transistor and emitter of the vertical NPN multicollector transistor are formed; a base contact region of the high-performance bipolar transistor is formed from the first polycrystalline layer simultaneously as the contact region 7' for the common collector of the lateral PNP transistor and base of the vertical NPN multicollector transistor, and the contact region 7" for the emitter of the lateral PNP transistor are formed; and an emitter contact region of the high-performance bipolar transistor is formed from the second polycrystalline layer simultaneously as the polycrystalline contact region 11' for the common base of the lateral PNP transistor and emitter of the vertical NPN multicollector transistor, and the multiple collectors 11" of the vertical NPN multicollector transistor are formed.

Schematic layouts of further embodiments of the invention are illustrated in FIGS. 3-6. The above described process can be used without modifications. Only the layouts are different.

Figure 3:
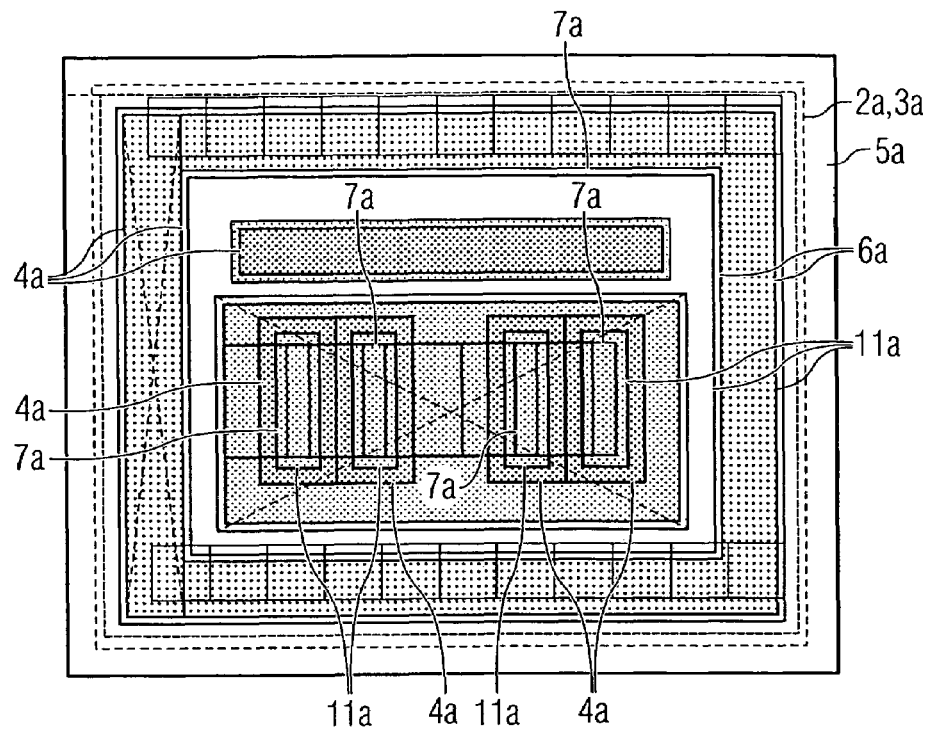
FIGS. 3-5 are schematic layouts of integrated injection logic circuits according to yet further embodiments of the invention.

In the embodiment illustrated in FIG. 3 the polycrystalline contact region 7' for the common collector of the lateral PNP transistor and base of the vertical NPN multicollector transistor is arranged together with the multiple collectors 11" of the vertical NPN multicollector transistor along a straight line. This can be seen by the mask layouts for the first 7a and second 11a deposited polycrystalline layers in FIG. 3.

Figure 4:
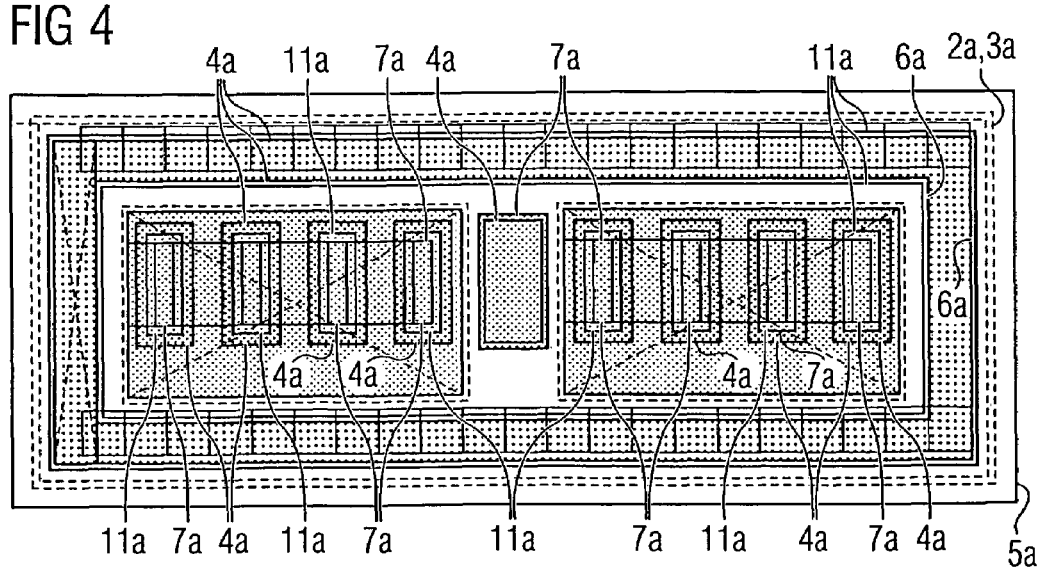

In the embodiment illustrated in FIG. 4 the contact region 7" for the emitter of the lateral PNP transistor is arranged together with eight collectors 11" of the vertical NPN multicollector transistor along a straight line. This can be seen by the mask layouts for the first 7a and second 11a deposited polycrystalline layers in FIG. 4.

Figure 5:
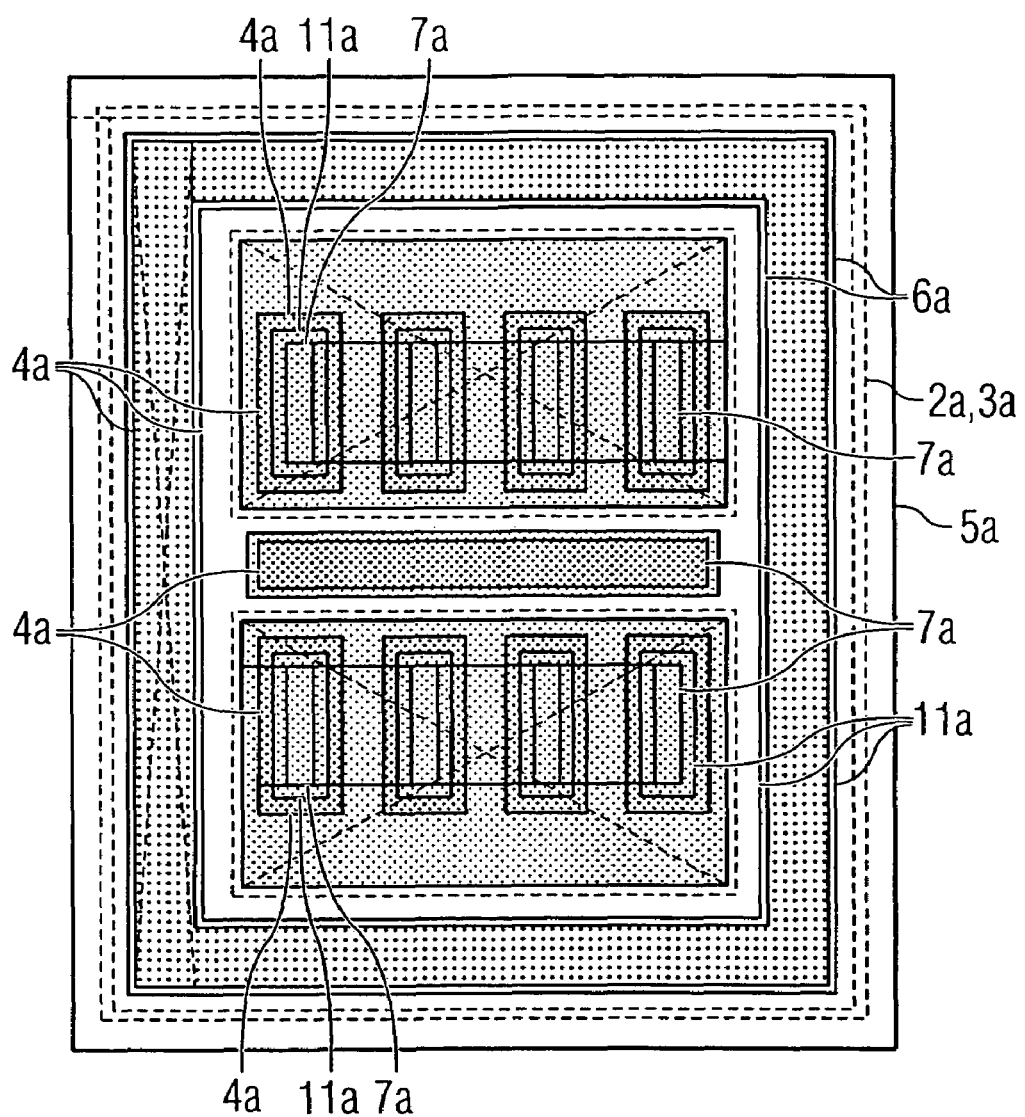

In the embodiment illustrated in FIG. 5 eight collectors 11" of the vertical NPN multicollector transistor are basically arranged along two straight and parallel lines, and the contact region 7" for the emitter of the lateral PNP transistor, and the contact region 7' for the common collector of the lateral PNP transistor and base of the vertical NPN multicollector transistor are elongated and arranged in parallel with the two straight and parallel lines, along which the eight collectors of the vertical bipolar multicollector transistor are arranged. This can be seen by the mask layouts for the first 7a and second 11a deposited polycrystalline layers in FIG. 5.

Figure 6:
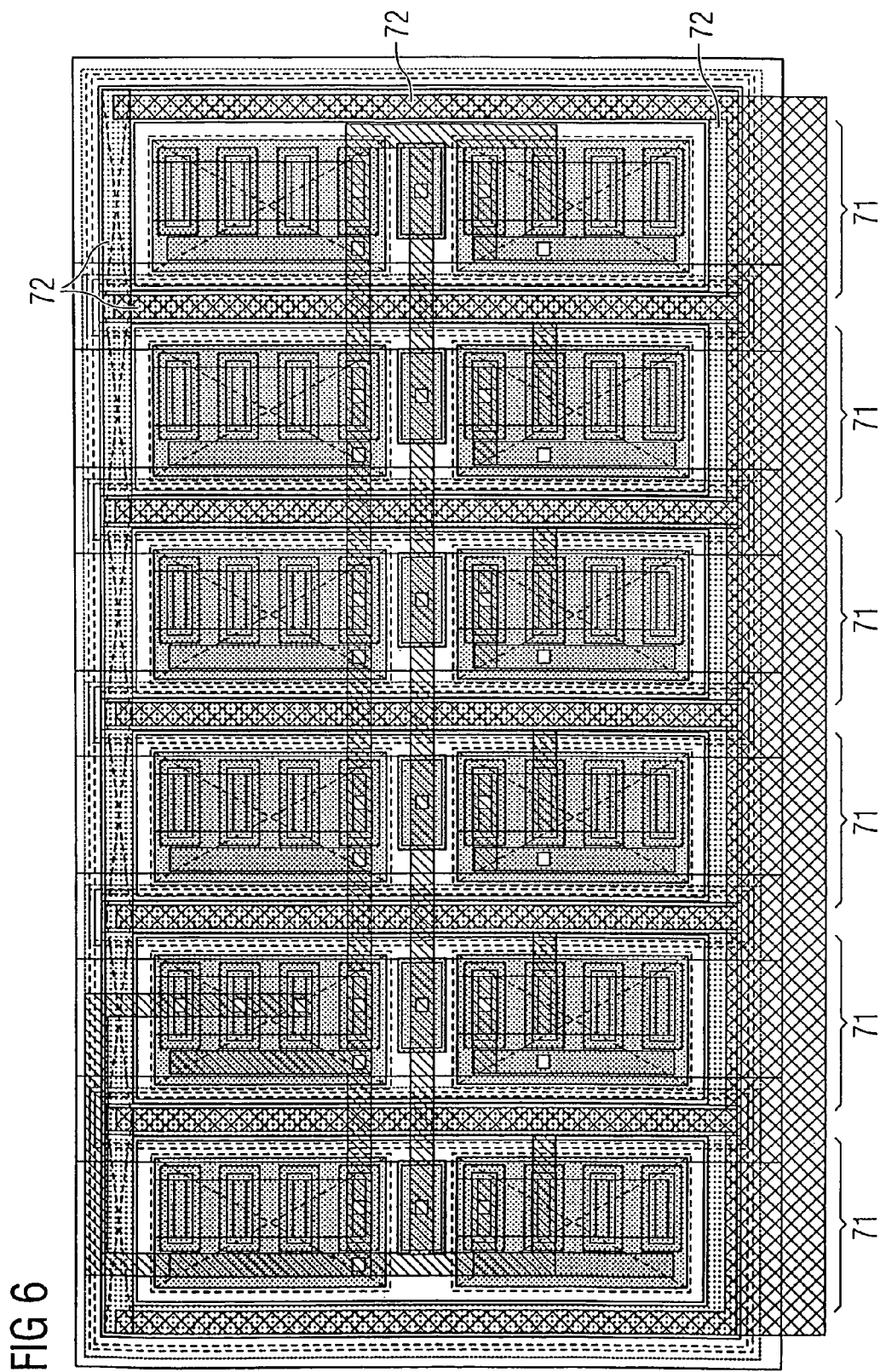
FIG. 6 is a schematic layout of an 11-stage ring oscillator comprising a plurality of the integrated injection logic circuit as being laid out in FIG. 4.

In the embodiment illustrated in FIG. 6 an 11-stage ring oscillator six integrated injection logic circuits 71, which are each of the kind illustrated in FIG. 4. Device isolation structures 72, particularly deep trenches, are formed to surround each of the six integrated injection logic circuits. Note that a dense structure is obtained since each two adjacent integrated injection logic circuits 71 share a straight trench structure in common.

The present invention being thus described can be used for the manufacturing of a large variety of logic circuit devices, particularly in combination with high-performance RF bipolar devices.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of manufacturing an integrated injection logic circuit, the integrated injection logic circuit including a lateral bipolar transistor of a first doping type and a vertical bipolar multicollector transistor of a second doping type opposite to said first doping type, the method comprising:
   forming in a substrate (i) a base of the lateral bipolar transistor common with an emitter of the vertical bipolar multicollector transistor, (ii) a collector of the lateral bipolar transistor common with a base of the vertical bipolar multicollector transistor, and (iii) an emitter of the lateral bipolar transistor;
   depositing a first polycrystalline layer on the substrate and forming, from the first polycrystalline layer, a polycrystalline contact region for the common collector of the lateral bipolar transistor and base of the vertical bipolar multicollector transistor, and a polycrystalline contact region for the emitter of the lateral bipolar transistor;
   depositing an isolation layer and forming, from the isolation layer, an isolation structure for electric isolation of the polycrystalline contact region for the common collector of the lateral bipolar transistor and base of the vertical bipolar multicollector transistor; and
   depositing a second polycrystalline layer and forming, from the second polycrystalline layer, a polycrystalline contact region for the common base of the lateral bipolar transistor and emitter of the vertical bipolar multicollector transistor, and multiple collectors of the vertical bipolar multicollector transistor.

2. The method of claim 1 wherein the common collector of the lateral bipolar transistor and base of the vertical bipolar multicollector transistor are formed as a plurality of laterally separated regions interconnected by the polycrystalline contact region for the common collector of the lateral bipolar transistor and base of the vertical bipolar multicollector transistor.

3. The method of claim 2 wherein the number of said plurality of laterally separated regions is equal to the number of the multiple collectors of the vertical bipolar multicollector transistor.

4. The method of claim 1 wherein the multiple collectors of the vertical bipolar multicollector transistor are arranged between the contact region for the emitter of the lateral bipolar transistor and the polycrystalline contact region for the common collector of the lateral bipolar transistor and base of the vertical bipolar multicollector transistor as seen in a lateral direction of said circuit.

5. The method of claim 4 wherein the multiple collectors of the vertical bipolar multicollector transistor are arranged along a substantially straight line, wherein the straight line is substantially orthogonal to said lateral direction.

6. The method of claim 1 wherein the multiple collectors of the vertical bipolar multicollector transistor are arranged along a substantially straight line, and wherein the contact region for the emitter of the lateral bipolar transistor or the polycrystalline contact region for the common collector of the lateral bipolar transistor and base of the vertical bipolar multicollector transistor is arranged together with the multiple collectors of the vertical bipolar multicollector transistor along the substantially straight line.

7. The method of claim 1 wherein the multiple collectors of the vertical bipolar multicollector transistor are arranged along two substantially straight and parallel lines, and wherein the contact region for the emitter of the lateral bipolar transistor and the polycrystalline contact region for the common collector of the lateral bipolar transistor and base of the vertical bipolar multicollector transistor are elongated and arranged substantially in parallel with the two substantially straight and parallel lines, along which the multiple collectors of the vertical bipolar multicollector transistor are arranged.

8. The method of claim 1 wherein an isolation structure in the form of a deep trench is formed to surround said integrated injection logic circuit.

9. The method of claim 1 wherein the common base of the lateral bipolar transistor and emitter of the vertical bipolar multicollector transistor, the common collector of the lateral bipolar transistor and base of the vertical bipolar multicollector transistor, and the emitter of the lateral bipolar transistor are formed in a bulk substrate.

10. The method of claim 1 wherein the common base of the lateral bipolar transistor and emitter of the vertical bipolar multicollector transistor, the common collector of the lateral bipolar transistor and base of the vertical bipolar multicollector transistor, and the emitter of the lateral bipolar transistor are formed in an SOI substrate.

11. The method of claim 1 wherein said method is implemented in a bipolar only process.

12. The method of claim 1 wherein the integrated injection logic circuit is manufactured as one of a plurality of integrated injection logic circuits in a logic circuit device, and the method is used to manufacture each of the plurality of integrated injection logic circuits.

13. The method of claim 12 wherein isolation structures in the form of deep trenches surround each of the plurality of integrated injection logic circuits.

14. The method of claim 1 wherein the integrated injection logic circuit is manufactured as part of a radio transceiver device.

15. The method of claim 14 wherein the radio transceiver device includes a bipolar amplifier device, and wherein said integrated injection logic circuit and said bipolar amplifier device are manufactured simultaneously on a single die.

16. The method of claim 15 wherein a collector of said bipolar amplifier device is formed in said substrate simultaneously as the common base of the lateral bipolar transistor and emitter of the vertical bipolar multicollector transistor are formed.

17. The method of claim 15 wherein a base contact region of said bipolar amplifier device is formed from the first polycrystalline layer simultaneously as the polycrystalline contact region for the common collector of the lateral bipolar transistor and base of the vertical bipolar multicollector transistor, and the polycrystalline contact region for the emitter of the lateral bipolar transistor are formed.

18. The method of claim 15 wherein an emitter contact region of said bipolar amplifier device is formed from the second polycrystalline layer simultaneously as the polycrystalline contact region for the common base of the lateral bipolar transistor and emitter of the vertical bipolar multicollector transistor, and the multiple collectors of the vertical bipolar multicollector transistor are formed.

* * * * *